United States Patent [19]
Dittman et al.

[11] Patent Number: 5,604,831
[45] Date of Patent: Feb. 18, 1997

[54] OPTICAL MODULE WITH FLUXLESS LASER REFLOW SOLDERED JOINTS

[75] Inventors: Eberhard S. Dittman, Granby, Canada; Mukund K. Saraiya, Endwell, N.Y.

[73] Assignee: International Business Machines Corporation, Armonk, N.Y.

[21] Appl. No.: 976,620

[22] Filed: Nov. 16, 1992

[51] Int. Cl.$^6$ .................................................. G02B 6/42
[52] U.S. Cl. ................................. 385/88; 385/89; 385/92; 219/121.63
[58] Field of Search ................................. 385/14, 88, 89, 385/92, 93, 94; 174/52.1, 59, 60, 61; 219/121.6, 121.63, 121.64, 121.65, 121.66; 29/840, 843, 845

[56] References Cited

U.S. PATENT DOCUMENTS

| | | | |
|---|---|---|---|
| 4,696,101 | 9/1987 | Vanzetti et al. | 29/740 |
| 4,728,787 | 3/1988 | Henry et al. | 385/91 |
| 4,970,624 | 11/1990 | Arneson et al. | 29/845 |
| 4,993,803 | 2/1991 | Suverison et al. | 385/88 |
| 5,004,317 | 4/1991 | Jackson et al. | 385/88 |
| 5,005,939 | 4/1991 | Arvanitakis et al. | 385/15 X |
| 5,039,194 | 8/1991 | Block et al. | 385/88 |
| 5,047,835 | 10/1991 | Chang | 357/74 |
| 5,070,604 | 12/1991 | Banba et al. | 29/845 |
| 5,146,526 | 9/1992 | Sweeney et al. | 385/90 |
| 5,155,786 | 10/1992 | Ecker et al. | 385/94 |
| 5,202,943 | 4/1993 | Carden et al. | 385/92 |
| 5,241,614 | 8/1993 | Ecker et al. | 385/94 |
| 5,276,754 | 1/1994 | Blair et al. | 385/88 |
| 5,302,801 | 4/1994 | Kanda et al. | 219/121.63 |
| 5,416,871 | 5/1995 | Takahashi et al. | 385/88 |
| 5,475,778 | 12/1995 | Webb | 385/88 X |

FOREIGN PATENT DOCUMENTS

| | | | |
|---|---|---|---|
| 2938254 | 3/1981 | Germany | 29/845 |
| 428287 | 1/1992 | Japan | 29/840 |

*Primary Examiner*—Rodney B. Bovernick
*Assistant Examiner*—Hemang Sanghavi
*Attorney, Agent, or Firm*—Michael E. Belk

[57] ABSTRACT

An optic module contains a flexible circuit board forming a cable which connects between an optical sub-assembly and a rigid interconnect structure within the optic module. One end of the cable includes lands proximate to through holes for soldered connection to pins which extend from the optical sub-assemblies. At the other end of the cable leads extend across interconnection pads on the surface of the rigid interconnect structure for soldered connection. The top surface of the interconnect pads is 10/90 (Sn/Pb) solder to provide a high temperature soldered joint. Solder flux can not be used because cleaning solvents would contaminate the interconnect structure. An atmosphere of formic acid mixed with nitrogen surrounds the lead and pad and a fluxless solder joint is formed.

19 Claims, 5 Drawing Sheets

OPTICAL MODULE WITH FLUXLESS LASER REFLOW SOLDERED JOINTS

CROSS REFERENCE TO RELATED APPLICATIONS

This application is related to the following concurrently filed application:

U.S. Ser. No. 07/976,632 filed Nov. 16, 1992 now U.S. Pat. No. 5,295,214 issued Mar. 15, 1994, Mukund K. Saraiya, Duane F. Card and Eberhard Dittmann, entitled: Optical Module With. Tolerant Wave Soldered Joints (IBM Docket EN9-92-141), incorporated herein by reference.

TECHNICAL FIELD

This invention relates to optical data transmission and particularly to optical modules which are connected to optical fibers for providing such data transmissions. Even more particularly, this invention relates to interconnection of components within optical modules and to flexible circuit boards.

BACKGROUND OF THE INVENTION

Manufacturers and those who utilize information handling systems have become interested in utilizing optical fibers for transmitting signals. Optical fibers include a round inner glass core coated with a material having a different index of refraction from that of the core. Light is transmitted along the core and reflected internally by the coating. Optical fibers may be enclosed in a protective sheath either as a single transmission line or as a bundle of fibers forming an optical cable. A single optical fiber has the potential to provide simultaneous bidirectional communication, however, as used in information systems today optical fibers are usually connected between optical sub-assemblies which either transmit or receive optical signals. Examples of various means for providing connections between optical fibers and electronic circuitry are illustrated in U.S. Pat. Nos. 4,273,413 (Bendiksen et al), 4,547,039 (Caron et al), 4,647, 148 (Katagiri), 4,707,067 (Haberland et al. ) and 5,005,939 (Arvanitakis et al. ) which are all incorporated herein by reference.

Optical modules include a two-part housing as described in U.S. Pat. No. 5,005,939 (Arvanitakis et al.). The housing provides two receptacle sections for mounting one or more and most commonly, two barrel-shaped optical sub-assemblies. Typically, one optical sub-assembly is a light transmitter for converting an electrical signal into an optical signal and the other is a light receiver for converting the optical signal into an electrical signal. The housing provides for precise alignment of the optical sub-assemblies with optical fibers contained in a suitable plug-in connector. Also within the housing is an electrical interconnect structure, typically a ceramic substrate with a circuit of screen printed electrical conductors on the upper surface, with electronic circuits connected to the electrical circuit on the upper surface. The internal interconnect structure includes leads or pins which protrude through apertures out of the housing to connect to an external electrical interconnect structure, typically a printed circuit board, to complete the optical-electrical connection.

One end of each optical sub-assembly communicates with a respective optic cable and from the other end, conductive pins extend axially for electrical connection to an adjacent edge of the internal interconnect structure in the housing. The central axis of each barrel-shaped optical sub-assembly extends parallel to the planer internal interconnect structure. The pins extend from the adjacent ends of the optical sub-assembly substantially above the interconnect structure so the pins are bent into an elbow or S-shape for soldered or welded connection to interconnection pads on the internal interconnect structure which provides electrical connection to the electronic circuit.

The interconnection pads on the internal interconnect structure are made by producing a solder pad on top of a conductive pad of the electrical circuit on the top surface of the ceramic substrate.

Recently, in U.S. Pat. No. 5,005,939 (Arvanitakis), it was proposed as an alternative to such soldering of the optical subassembly pins directly to the interconnection pads of the internal interconnect structure, that a flexible interconnect structure be used to connect between the pins and the interconnection pads. That patent discloses one end of a ribbon cable soldered to the pins of an optical sub-assembly and a distal end of the cable soldered to the interconnection pads of the internal interconnect structure. That patent also disclosed that utilizing a flexible ribbon cable would reduce electromagnetic interference and that additional ESD/EMI protection could be provided by providing a multilayer ribbon cable which included a ground layer.

Materials and processes for manufacturing conventional flexible ribbon cables are well known, for example, U.S. Pat. No. 4,906,803 (Albrechta) and U.S. Pat. No. 4,435,740 (Huckabee et al. ), incorporated herein by reference, describe production of a flexible cable including a conductive circuit layer which may be copper and a dielectric layer of polymer such as Kapton®. Typically a conductive metal film is coated with a positive or negative photoresist which is exposed to electromagnetic radiation using a mask and cured and otherwise processed to produce a photoresist pattern. The metal film which is not covered by the photoresist is selectively chemically etched to form the conductive circuit layer. The photoresist is then usually removed. Dielectric layers are etched using a similar chemical process or by laser etching/ablation to form windows through the dielectric layer. The dielectric is laminated onto one or both sides of the circuit layer with the windows positioned for interconnection of the cable to pins of electronic components and termination connections to pads on electrical interconnect structures.

The terminal connections to pads are formed by laying the exposed copper conductive paths or leads across conductive pads on the substrate and welding or soldering. U.S. Pat. No. 4,697,061 (Sparer et al.) describes a process in which a tin coated copper covering is ND-YAG laser welded to a tin coated copper base which is soldered to a screen printed circuit on top of a ceramic substrate. A hold-down clamp presses the cover against the base during welding. U.S. Pat. No. 4,906,812 (Nied et al.) describes a machine for laser welding, braising or soldering in an inert atmosphere. U.S. Pat. No. 4,825,034 (Auvert et al.) discusses a laser machine with movable platen and U.S. Pat. No. 5,048,034 (Tulip) disclose a Nd:YAG laser machine. U.S. Pat. No. 4,926,022 (Freedman) describes a laser soldering procedure in which a continuous wave Nd:YAG laser beam is directed only at the pad while a hold-down appliance presses the lead into the pad. The patent also describes problems encountered in attempting to heat the lead for such soldering including non co-planarity, overheating, and obscuring the lead with the hold down appliance. U.S. Pat. No. 5,021,630 (Benko et al.) discloses utilizing clear glass for holding down the lead during laser soldering. Finally, U.S. Pat. No. 5,008,512 (Spletter) discloses a copper lead coated with tin or indium and laser soldered to a gold electrical bump with a pulsed YAG laser.

DISCLOSURE OF THIS INVENTION

It is, therefore, an object of this invention to provide a more reliable optical module.

It is another object of the invention to provide a process for assembling the optical module utilizing high speed automation.

It is also an object of this invention to connect a flexible ribbon cable to a high temperature circuit on a ceramic substrate utilizing a fluxless laser soldered joint; and more generally to provide for attaching leads to a electrical interconnect structure utilizing the fluxless laser soldered joint.

It is another object of this invention to provide an improved hold-down apparatus for laser soldered connection.

It is another object of the invention to provide an atmosphere for fluxless laser soldering.

It is another object of the invention to provide a laser for fluxless soldering of leads to a ceramic substrate.

It is another object of the invention to provide a fluxless laser soldering machine for automated production of the optical modules of the invention.

Finally, it is an object of this invention to provide a process for fluxless laser soldering of leads to solder pads on a substrate; more specifically for soldering copper leads to 10/90 (Sn/Pb) solder pads on conductive pads on the surface of a ceramic interconnect structure without leaving any flux residue.

In the invention of applicants, optical sub-assemblies are connected to first ends of respective flexible ribbon cables. The sub-assemblies are automatically positioned in the bottom section of a two part housing with leads extending from a second end of the flexible ribbon cables positioned on 10/90 (Sn/Pb) solder pads provided on conductive pads of the thin-film electrical circuit on the top surface of a ceramic interconnect structure bonded in the bottom section. The bottom section of the housing is positioned in a laser soldering machine, and an atmosphere or cloud of inert gas mixed with formic acid for fluxless soldering. For each lead, the molybdenum surface of a probe tip is extended to press the lead against the solder pad while a CW (Continuous Wave) Nd-YAG laser heats the lead adjacent to the probe which heats the solder in contact with the lead in order to form fluxless solder joint between the lead and solder pad.

Other features and advantages of this invention will become apparent from the following detailed description of the presently preferred embodiment and alternative embodiments of the invention, taken in conjunction with the accompanying drawings.

DETAILED DESCRIPTION OF THE DRAWINGS

Figure 1:
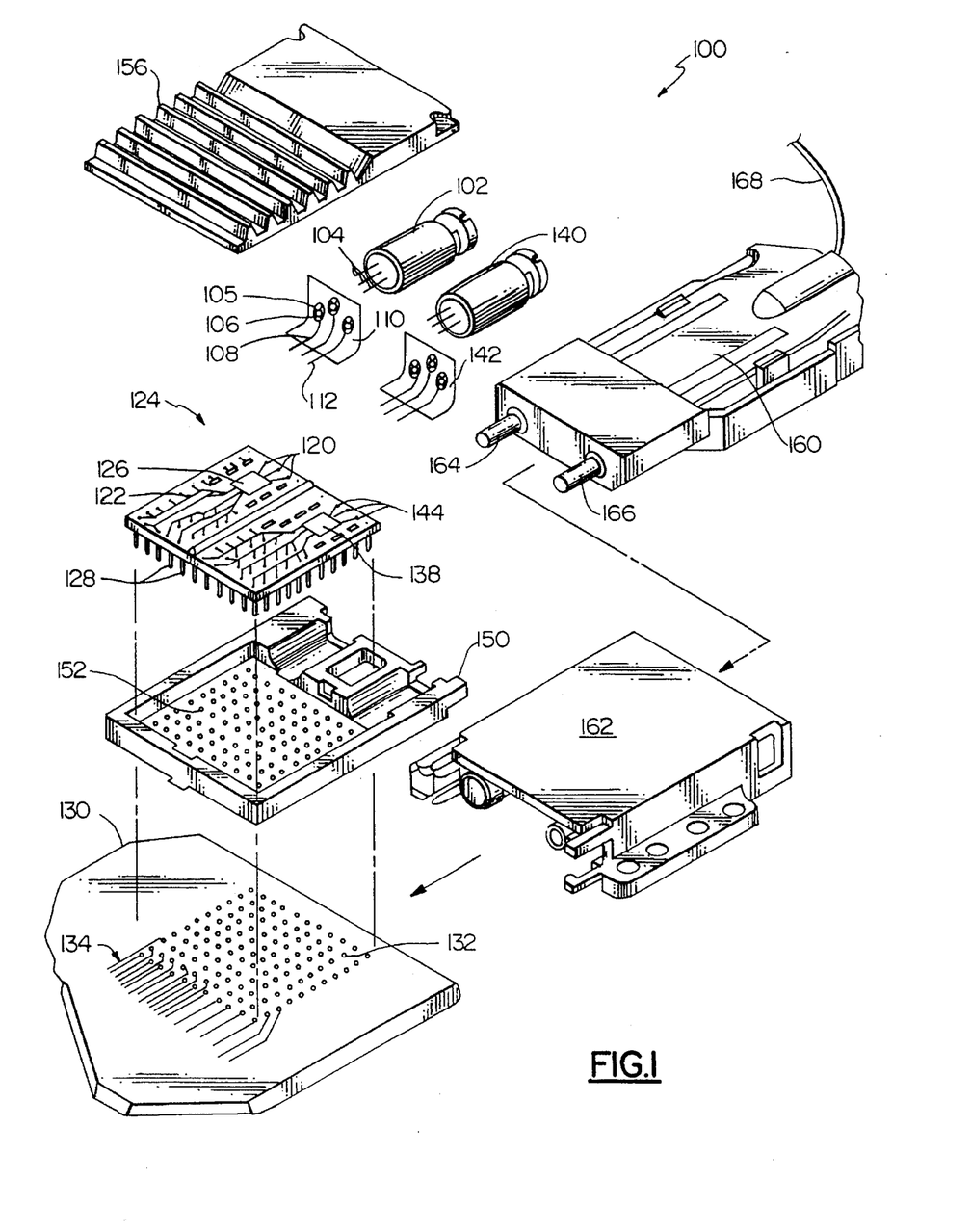
FIG. 1 is an exploded perspective view of an optical module in accordance with this invention and showing a duel optical plug connector for connection thereto.

FIG. 1 shows a specific embodiment of the optical module 100 of this invention. Longate optical sub-assembly 102 receives a first, optical signal in a port (not shown) in one longitudinal end of module 102. The module converts the first, optical signal into a first, electrical signal which is output through conductive pins 104 at the distal longitudinal end of the module. Pins 104 are soldered to flat, donut-shaped conductive, solder-wettable lands 105 encircling through holes at 106. The lands are on the surface of flexible ribbon cable 110 and are integrally connected to conductors 108 extending within dielectric layers of flexible ribbon cable 110. The connection between pins 104 and cable 110 may be made by introducing solder preforms or solder paste and reflowing or preferably by mass soldering such as immersion or most preferably by wave soldering. The flexible ribbon cable is bent 90 degrees as shown so that exposed leads 112 of conductors 108 are positioned on interconnection pads 120 of thin film screen printed electrical circuit 122 which is on the top surface of interconnect structure 124 which is preferably of rigid construction and more preferably of ceramic construction. The connection of cable 110 with pads 120 is provided by laser soldering as later described in this specification. Electronic circuit 126 processes the first, electrical signal and transmits a first processed electrical signal. Electronic circuit 126 is connected through output conduits of electrical circuit 122 which are connected to pins 128. The first, processed, electrical signal is transmitted from electronic circuit 126, through electrical circuit 122, to pins 128. When the optical sub-assembly is positioned on electrical interconnect structure 130 such as a flexible circuit board or a printed circuit board, pins 128 couple with connectors 132 of an electrical circuit 134 which extends on the exterior and/or the interior of interconnect structure 130. The first, processed, electrical signal is transmitted from the pins into interconnect structure 130.

A second, electrical signal is transmitted from external interconnect structure 130, through pins 128, through electrical circuit 122, and to electronic circuit 138 which processes the second electrical signal. In a manner similar to the connection of optical sub-assembly 102, optical sub-assembly 140 is connected through flexible ribbon cable 142 to interconnection pads 144 of electrical circuit 122 which is connected to electronic circuit 138. Thus, the second electrical signal is processed and transmitted to optical subassembly 140 which converts the second, processed, electrical signal into a second optical signal which is transmitted through a port (not shown) in one end of the module.

Optical modules 102 and 140 and rigid interconnect structure 124 are mounted within a housing of two part construction preferably of cast aluminum which may be machined as required. The bottom of lower part 150 of the housing includes a matrix of apertures 152 through which pins 128 of interconnect structure 124 extend to communicate with interconnect structure 130. Alternately a window (not shown) could be provided in the bottom of lower part 150 for the pins. Preferably structure 124 is held in a fixed position in lower part 150 by adhesive, preferably epoxy. The optical sub-assemblies may also be fixed in position by an adhesive such as epoxy or may be positioned by keys to allow limited movement for adjustment to tolerances in the dimensions of plug in module 160. The top of upper part 154 of the housing includes fins 156 for cooling the optical module.

Optical plug 160 connects into guide 162 to position optical connectors 164 and 166 in relation to apertures (not shown) in one end of each optical sub-assembly 102 and 140 respectively, so that bidirectional optical communication may be provided between the optical fibers of cable 168 and optical module 100.

The substrate is metallized ceramic such as alumina and the circuit is produced by evaporation or sputtering and a selective subtractive lithographic process to produce a wiring layer. Preferably the metallization is 80 Å chromium, 8,000-80,000 Å copper, and finally another 80 Å chromium. The substrate may be multilayer ceramic. Alternatively, the substrate may be a metal or resin such as fiberglass. The copper pads are 50 by 60 mils and the solder layer is produced by etching to remove the chromium surface from the pads followed by plating about 40 mils of 10/90 (Sn/Pb) solder onto the pads.

Part of this invention is the discovery that when the pins of the optical sub-assemblies are bent and joined directly to the interconnection pads, there was a high rate of failure in the pins or joints over the life of the optical modules. It is also the discovery of applicants that these failures could be eliminated in the optical module of this invention by utilizing a flexible ribbon cable to connect between the pins of the optical sub-assembly and the ceramic interconnect structure.

Flux should not be utilized in making the joint between the leads and the interconnection pads because integrated circuits are connected or will be connected to the top surface of the interconnect structure. Furthermore, due to high operating temperatures normal eutectic solders should not be utilized. Also, the electronic circuits are attached using flip-chip/solder ball technology. Due to thermal mismatch between the chip and substrate, the tin content is high to provide flexibility. Preferably, the solder is 20/80 to 3/97 and most preferably approximately 10/90 (Sn/Pb). Previous techniques of fluxless laser soldering could not provide a high quality, closely spaced joint on the ceramic substrate possibly because of the high heat transfer through the ceramic material. This invention has enabled high quality 10/90 (Sn/Pb) soldered connections on a ceramic substrate to be spaced closer than 2 mm.

Figure 2:
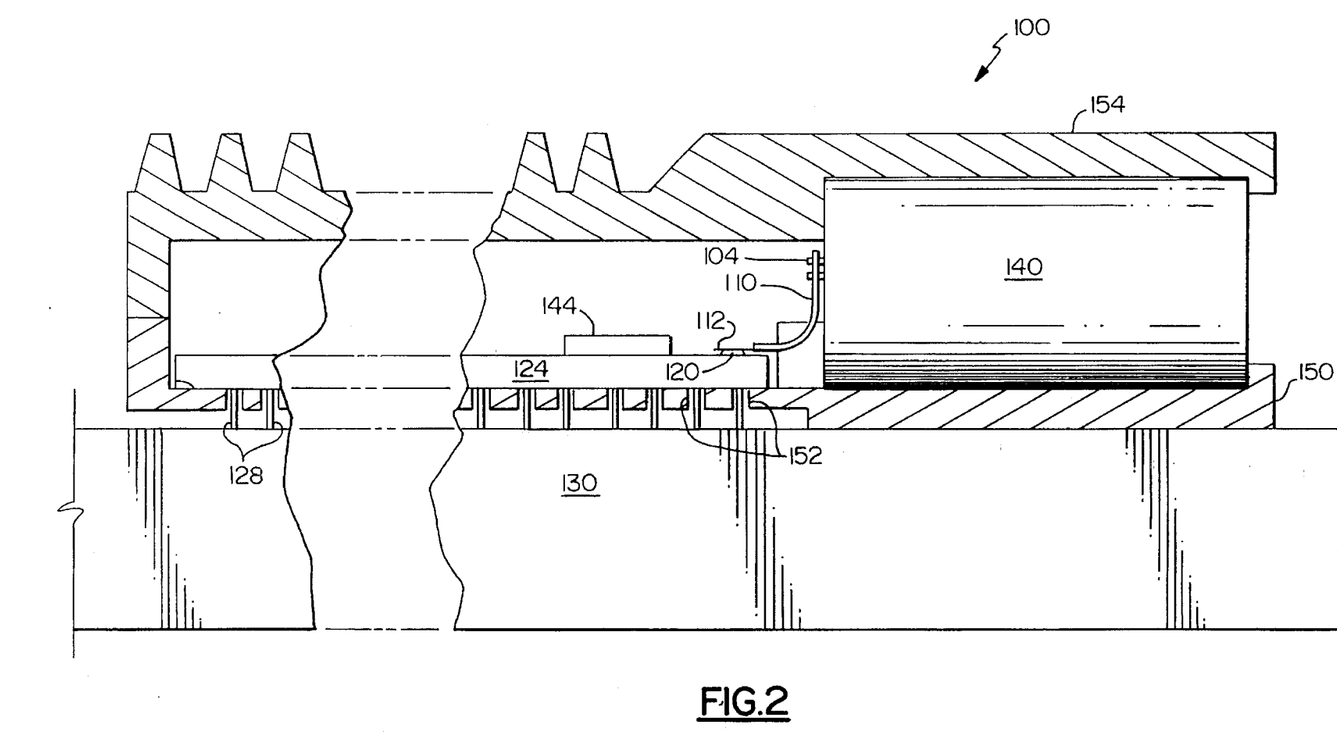
FIG. 2 is a side elevation partial section of the optical module of FIG. 1, showing the connection of the invention between one of the optical sub-assemblies and the ceramic electrical interconnect structure within the housing.

FIG. 2 will be described using the same labels as FIG. 1 for the same components. FIG. 2 is a partial section view of selected parts of optical module 100 of this invention mounted on a section of printed circuit board 130. Optical sub-assembly 140 and ceramic interconnect structure 124 with electronic circuit 144 are mounted between upper cover part 154 and lower part 150. Pins 104 extend axially from optical sub-assembly 140 and through passages at one end of flexible ribbon cable 110. The leads are wave soldered to lands (not shown) on the ribbon cable proximate to the passages. Extending from the lands, electrical conductors within dielectric layers of cable 110 extend from the lands to the distal end of the cable where they are exposed as leads 112 and laser soldered to interconnection pads 120 which are electrically connected to electronic circuit 144 for passing electrical signals between sub-assembly 140 and electronic circuit 144. Pins 128 pass through apertures 152 in the bottom plate of the lower part 150 to connect into the electrical circuit of printed circuit board 130.

The electronic circuits are connected to the ceramic interconnect structure prior to connection to the optical sub-assemblies, therefore flux can not be used in the soldering operation because solvents such as water can not be used to clean the flux off from the substrate.

Figure 3:
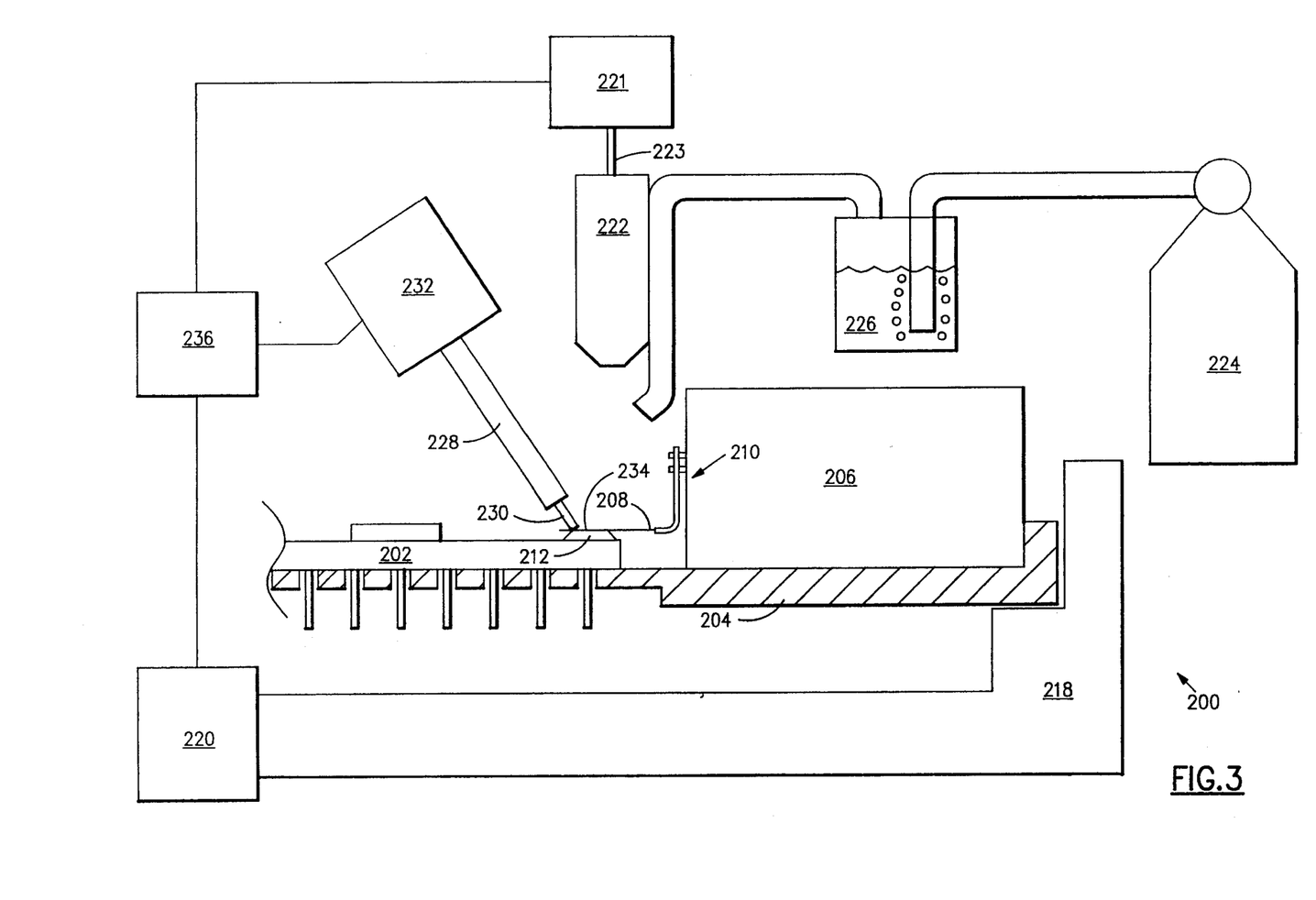
FIG. 3 is a schematic elevation view of the optical module in a machine of the invention for fluxless laser soldering.

FIG. 3 illustrates laser soldering machine 200 of the invention. Ceramic interconnect structure 202 is preferably bonded in the lower section 204 of the two-part aluminum housing. Optical sub-assembly 206 is also positioned in the lower section with leads 208 of flex cable 210 positioned across interconnection pad 212. Lower section 204 of the housing is automatically loaded in stage/conveyor 218 of laser soldering machine 200 and is positioned preferably by a motor 220 relative to laser apparatus 222 for automated laser soldering of lead 208 onto pad 212. Inert gas, preferably nitrogen, from source 224 is mixed with formic acid 226 preferably by bubbling the nitrogen through a reservoir of the acid to produce a mixture of inert gas and formic acid. The gas mixture is delivered to surround lead 208 and pad 212 with an atmosphere or cloud of inert gas mixed with formic acid for fluxless soldering. Probe 228, with surface 230 at the tip composed of a material which is not wettable by solder and is preferably molybdenum, is extended by robot 232 to press against lead 208 to provide good contact between lead 208 and pad 212. The robot may include a spring (not shown) to provide a preset spring load against the lead when the probe is extended. A beam (not shown) is directed by laser unit 221, into optic cable 223, and through head 222 onto lead 208 at 234 which is adjacent to tip 230 of probe 228. The beam heats the lead and the heat is conducted to the surface of pad 212 in contact with the lead to heat the contacting pad surface sufficient for soldering the lead to the pad. The heat from the laser beam reaches the probe tip therefore the tip is preferably constructed of a high temperature material such as molybdenum to provide long service life. Laser 222, motor 220 and robot 232 are connected to controller 236 which automatically directs the laser reflow soldering process.

Preferably the laser unit is a Nd:YAG, CW, 60W laser as provided by MBB of Germany. The controller is an IBM PS/2. The robot includes an IBM System 7576 with a 7576 manipulator, 7532 industrial computer and a 7572 servo power module, the laser head includes optics and an optic fiber connected to the laser unit, a pilot laser, an IR measuring device, and a CCTV camera.

Figure 4:
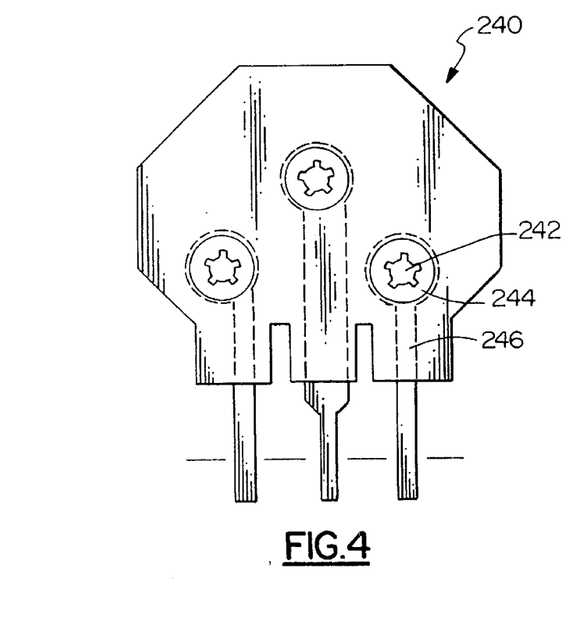
FIG. 4 is a plan view of a specific flexible ribbon cable embodiment of this invention for laser soldering leads to interconnection pads on a ceramic substrate.

FIGS. 4 illustrates a specific embodiments of the flexible ribbon cable 240 of this invention with 3 conductors. Typically 3 or 4 conductors can be used in optical modules. The ribbon cables are produced by laminating multiple layers of material which include at least one conductive layer and one dielectric layer. Alternatively, the layers may be built up. The thickness of the layers are selected to provide reliability, ease of construction and minimized material costs. Preferably the conductive layer is less than 0.3 mm thick and is sandwiched between two dielectric layers which are less than 0.1 mm thick.

At one end of each cable apertures 242 have been prepared for soldered connection with pins (not shown) extending from one end of an optical sub-assembly. Proximate to each aperture a window is provided in the dielectric layers to expose a land 244 attached to a conductor 246 both of an electrical circuit sandwiched between the dielectric layers of the cable. The lands may be for example circular or C-shaped and the electrical circuit of the land and conductor may be any thin layer of conductive solid such as copper or copper coated with chromium for enhanced adhesion with the dielectric layers. A layer of adhesive, preferably epoxy, may be provided to connect the conductive material and the dielectric.

At the other end of the cable, the conductors of the circuit extend out of the dielectric layers for soldered connection at line 248 to conductive pads (not shown) of the electrical circuit of a ceramic interconnect structure.

Figure 5:
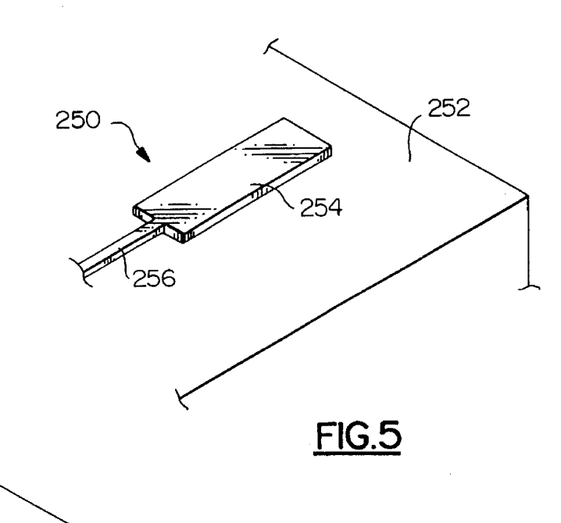
FIG. 5 is an isometric view of a conductive pad of the thin film circuit on the top surface of a ceramic interconnect structure.

FIG. 5 illustrates a section 250 of the electrical circuit on the surface of ceramic substrate 252. Circuit section 250 includes a rectangular conductive pad 254 integral with a narrower conductive path 256.

Figure 6:
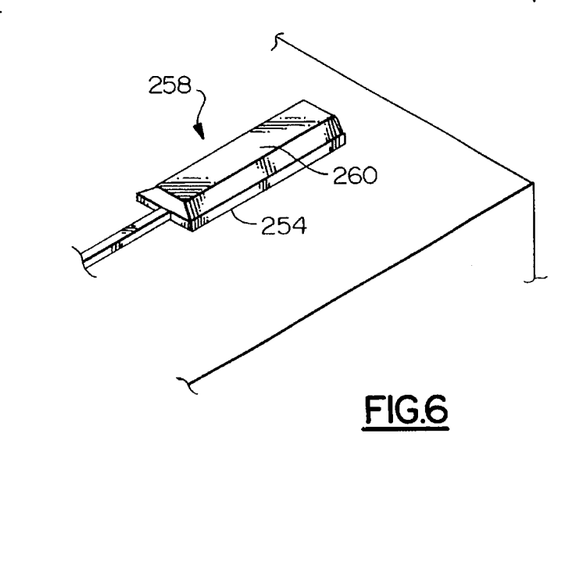
FIG. 6 is an isometric view of an interconnect pad of the invention in which a solder pad is attached on the top of the conductive pad of FIG. 4 on the ceramic interconnect structure.

FIG. 6 shows a completed interconnect pad 258 which includes a flat rectangular pad of approximately 10/90 (Sn/Pb) solder plated to the top of conductive pad 254 to provide a 10/90 (Sn/Pb) solder top surface 260 for reflow soldering to a lead.

Figure 7:
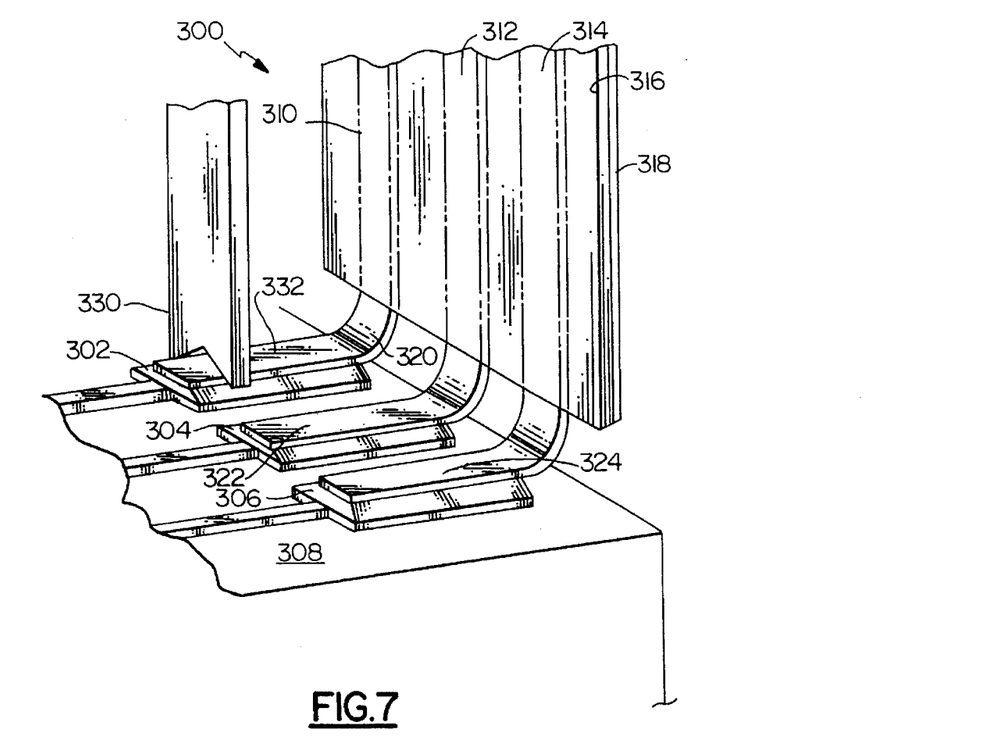
FIG. 7 is an isometric view of three leads extending from an end of a flexible ribbon cable and positioned across the top solder pads of FIG. 5 and illustrating a molybdenum surfaced tip of a probe of the invention holding a lead against a solder pad for laser soldering.

In FIG. 7 flexible ribbon cable 300 is positioned for attachment to three interconnection pads 302,304 and 306 on the surface of ceramic substrate 308. Cable 302 includes three rectangular conductive paths 310, 312 and 314 generally enclosed between flexible dielectric layers 316 and 318. The conductive paths 310, 312 and 314 extend out of dielectric layers at the lower end of the ribbon cable as leads 320,322,324 respectively. Preferably, the leads are pre-tinned, i.e., covered with a solder wettable/anti-oxidizing coating such as tin or preferably with eutectic 63/37 (Sn/Pb) solder. Molybdenum coated, probe tip 330 presses against lead 320 to provide high quality thermal and mechanical contact between lead 320 and the 10/90 (Sn/Pb) solder top surface of interconnection pad 302 for soldered connection. The beam of a Nd-YAG laser is directed onto the lead at 332 which is adjacent to the end of probe tip 330 to heat lead 320 by incident radiation and to heat the top surface of pad 302 by conduction for reflow soldering the lead to the pad.

Figure 8:
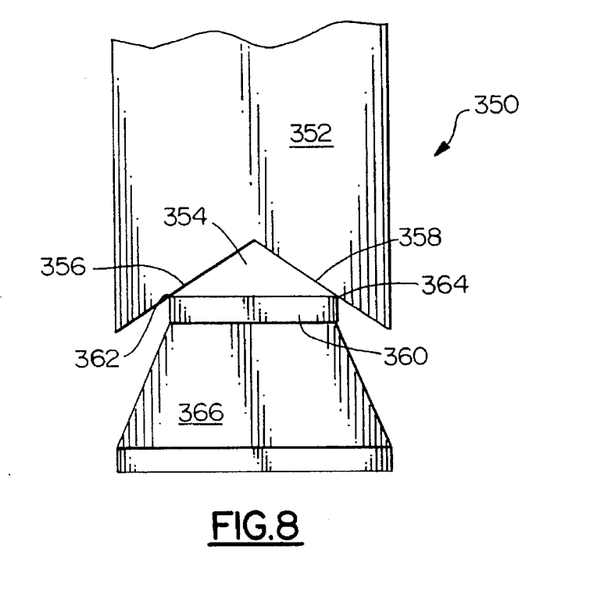
FIG. 8 is an elevational view of the probe tip of the invention.

In FIG. 8, tip 350 of probe 352 has notch 354 with internal sides 356 and 358 angled for contacting lead 360 only at edge corners 362 and 364 for minimizing the heat flow from the lead into the probe. This minimizes damage to the probe tip and allows more heat to flow into solder pad 366 for high temperature reflow soldering.

While the currently preferred embodiment and alternate embodiments of this invention have been illustrated and described, various changes and modifications may be made therein within the scope of this invention which is defined by the following claims.

We claim:

1. An optical module for providing communication with fiber optic means, comprising:

a housing including at least one receptacle for connection with fiber optic means;

one or more optical sub-assemblies each having multiple solder-wettable conductive pins extending from one end for receiving or transmitting electrical signals, for transceiving between the electrical signals and optical signals, and positioned to communicate with said fiber optic means connected in the receptacle for transmitting or receiving the optical signals from or to said fiber optic means;

electronic circuit means for processing the electrical signals transmitted by the optical sub-assemblies or for transmitting electrical signals to the optical sub-assemblies;

an interconnect structure located within said housing adjacent said sub-assemblies on a side of the optical sub-assembly from which the pins extend, having a row of conductive pads for soldered connection, and having conductive vias for electrical interconnection between said conductive pads and said electronic circuit means;

flexible ribbon cables for respective optical sub-assemblies for transmitting signals between the pins of the respective optical sub-assembly and said conductive pads, the cables respectively including:

a flexible conductive film layer patterned to provide a multiple of conductive paths which extend as leads from one end of the flexible ribbon;

a flexible dielectric film layer on each major surface of the conductive layer and which does not extend completely over the leads;

at least two passages at an other end of each cable, through which a respective pin of the respective optical sub-assembly is inserted; and solder-wadable lands proximate said passages and connected to the conductive paths of the flexible ribbon cable for soldered connection between the lands and the pins;

solder joints connecting between the respective pins of the sub assemblies and the lands of the cables;

a solder pad of Pb and 3 to 20% Sn solder alloy on one of the conductive pads on the surface of the interconnect structure for each respective lead; and a reflow solder joint of Pb and 3 to 20% SN solder alloy between each solder pad and respective lead.

2. The module of claim 1, in which the reflow solder joint is fluxless.

3. The module of claim 1, in which the lead is a thin copper film less than 0.3 mm thick.

4. The module of claim 1, in which the lead is covered with a solder wettable coating.

5. The module of claim 1, in which the conductive pad is on a ceramic substrate.

6. The module of claim 1 in which the housing includes two receptacles for connection to respective fiber optic means;

the sub assemblies include a first assembly for receiving electrical signals through the pins, transducing the electrical signals to optical signals and transmitting the optical signals to the fiber optic means;

the sub assemblies include a second assembly for receiving optical signals from fiber optic means, transducing the optic signals to electrical signals, and transmitting the electrical signals through the pins;

the electronic circuit means include both means for processing electrical signals transmitted to the first assembly and means for processing signals received from the second sub assembly;

the flexible ribbon cables include a first cable for communication between the interconnect structure and the first sub assembly and a second separate cable for communication between the interconnect structure and the second sub assembly;

the first and second cables each including at least three conductive vias each connected between a respective land and a respective solder pad of the interconnect structure.

7. An automated process for interconnecting the components of an optical module, comprising the steps:

producing top and bottom sections of an aluminum housing with one or more receptacles;

forming ribbon cables of at least one layer of conductive film, including the steps of:

etching to pattern a conductive film to provide lands at a first end of the cable and conductive vias connected to the lands and extending towards a second end of the cable;

etching dielectric film to provide windows corresponding to the lands and to apertures through the dielectric film at the lands; and     laminating the films together to form the cable with exposed and apertures through the cable at the lands and the conductive vias extending from the second end of the cable to provide connecting leads;

attaching optical sub-assemblies to respective ribbon cables by the steps of:

inserting multiple solder-wettable pins extending from one end of the optical sub-assembly, into respective apertures in the first end of a respective ribbon cable; and     connecting all the leads of each sub-assembly to respective lands by wave soldering to form solder joints in a single step;

forming on the top surface of a substrate, an electrical circuit including conductive vias and a row of conductive pads connect to the conductive vias, said substrate having terminals extending from the bottom surface;

producing pads of Pb and 3 to 20% Sn solder alloy on top of the conductive pads in the row;

bonding the substrate into the bottom section of the housing so that the terminals extending from the bottom of the substrate, protrude through one or more apertures in the bottom section of the housing;

positioning each optical sub-assembly in a respective receptacle for communication with fiber optic means and positioning ends of the conductive paths extending from a second end of said ribbon cables, each across a respective solder pad of said row of solder pads;

positioning the optical module in a laser soldering machine;

laser reflow soldering each lead to the respective solder pad including the steps of:

applying a mixture of a mild acid suspended in an inert gas to the lead and solder pad;

extending the tip of a probe with a tip surface of non solder-wettable high temperature material, to press against the top of the lead for pressing the lead against the solder pad to provide high quality contact between the lead and solder pad; and     directing a beam from a laser onto the lead adjacent to probe tip for heating the lead for heating the solder pad at the lead sufficient for fluxless soldering of the leads onto the solder pads.

8. The process of claim 7 in which, the non-solder wettable high temperature material includes molybdenum.

9. The process of claim 7 in which the step of applying a mixture includes the step of, bubbling the inert gas through formic acid to suspend the formic acid into the inert gas.

10. The process of claim 7 in which the lead includes, a thin copper film of approximately rectangular cross section and less than 0.3 mm thick.

11. The process of claim 7 in which, the substance includes a ceramic electrical interconnect structure.

12. The process of claim 11 in which, the conductive pad is on a ceramic substrate and includes a copper layer plated with about 4 mils of solder.

13. The process of claim 7 in which the dielectric layer is less than 0.1 mm thick.

14. The process of claim 7 in which the step of forming ribbon cables includes depositing a thin layer of solder on the lands to assure solder wetting to the lands.

15. The process of claim 7 in which the step of forming an electric circuit includes screen printing with conductive ink on a substrate that includes ceramic material.

16. The process of claim 7 in which the mild acid is formic acid.

17. The process of claim 7 in which the step of producing pads of solder includes depositing solder including Pb and approximately 10% Sn.

18. The process of claim 7 in which the laser is a Nd-YAG laser.

19. The process of claim 7 in which the end of the probe is formed with a v-notch to press against only the edges of the lands.

\* \* \* \* \*

UNITED STATES PATENT AND TRADEMARK OFFICE
CERTIFICATE OF CORRECTION

PATENT NO.  : 5,604,831

DATED       : February 18, 1997

INVENTOR(S) : Eberhard S. Dittman and Mukund K. Saraiya

It is certified that error appears in the above-identified patent and that said Letters Patent is hereby corrected as shown below:

Column 8, line 28, change "solder-wadable" to "solder-wettable".

Signed and Sealed this

Twenty-first Day of October 1997

Attest:

BRUCE LEHMAN

Attesting Officer

Commissioner of Patents and Trademarks